United States Patent [19]

Wada et al.

[11] Patent Number: 5,801,383

[45] Date of Patent: Sep. 1, 1998

[54] VOX FILM, WHEREIN X IS GREATER THAN 1.875 AND LESS THAN 2.0, AND A BOLOMETER-TYPE INFRARED SENSOR COMPRISING THE VOX FILM

[75] Inventors: Hideo Wada; Mitsuhiro Nagashima; Naoki Oda; Tokuhito Sasaki; Toru Mori, all of Tokyo, Japan

[73] Assignees: Masahiro Ota, Director General, Technical Research and Development Institute, Japan Defense Agency; NEC Corporation, both of Tokyo, Japan

[21] Appl. No.: 754,140

[22] Filed: Nov. 22, 1996

[30] Foreign Application Priority Data

Nov. 22, 1995 [JP] Japan .................. 7-304226
Mar. 27, 1996 [JP] Japan .................. 8-071983

[51] Int. Cl.$^6$ .................. H01L 25/00; G01J 5/00
[52] U.S. Cl. .................. 250/332
[58] Field of Search .................. 250/332, 338.1

[56] References Cited

U.S. PATENT DOCUMENTS

| | | | |
|---|---|---|---|
| 3,711,718 | 1/1973 | Paul | 250/210 |
| 3,886,578 | 5/1975 | Eastwood | 357/4 |
| 4,401,690 | 8/1983 | Greenberg | 427/87 |
| 5,274,241 | 12/1993 | Radford et al. | 250/515.1 |
| 5,286,975 | 2/1994 | Cole | 250/349 |
| 5,602,043 | 2/1997 | Beratan et al. | 437/3 |
| 5,640,013 | 6/1997 | Ishikawa et al. | 250/338.4 |
| 5,650,622 | 7/1997 | Ookawa et al. | 250/332 |
| 5,698,852 | 12/1997 | Tanaka et al. | 250/332 |

FOREIGN PATENT DOCUMENTS 3136379  6/1991  Japan .
4307977  10/1992  Japan .

OTHER PUBLICATIONS

G. V. Jorgenson et al, "Doped Vanadium Oxide for Optical Switching Films", *Solar Energy Materials 14* (1986), pp. 205–214.

Guillermo Guzman et al, "Synthesis of Vanadium Dioxide Thin Films from Vanadium Alkoxides", *Materials Research Bulletin*, vol. 29, No. 5, pp. 509–515, 1994.

Hubert Jerominek et al, "Vanadium Oxide Films for Optical Switching and Detection", *Optical Engineering*, Sep. 1993, vol. 32, No. 9, pp. 2092–2098.

D. P. Partlow et al, "Switchable Vanadium Oxide Films by a Sol–Gel Process", *Journal of Applied Physics*, vol. 70, 1991, No. (1 Jul.), pp. 443–452.

*Primary Examiner*—C. H. Kelly
*Attorney, Agent, or Firm*—Sughrue, Mion, Zinn, Macpeak & Seas, PLLC

[57] ABSTRACT

At a heat treatment temperature in a reducing atmosphere of Ar and $H_2$, a precursory film of $V_2O_5$ is reduced into a $VO_x$ film with the heat treatment temperature selected in a predetermined temperature range between 350° C. and 450° C., both exclusive, to control a resistivity of the $VO_x$ film, where x is greater than 1.875 and less than 2.0. The $VO_x$ film is not susceptible to a metal-semiconductor phase transition inevitable in $VO_2$ at about 70° C. and is excellent for use in a bolometer-type infrared sensor. When reduced at 350° C. and 450° C., the resistivity and its temperature coefficient of the $VO_x$ film at room temperature are 0.5 and 0.002 Ω cm and −2.2% and 0.2% per degree Celsius.

18 Claims, 5 Drawing Sheets

VOX FILM, WHEREIN X IS GREATER THAN 1.875 AND LESS THAN 2.0, AND A BOLOMETER-TYPE INFRARED SENSOR COMPRISING THE VOX FILM

BACKGROUND OF THE INVENTION

This invention relates to a method of controlling electric characteristics of a vanadium oxide film which is used in a bolometer-type infrared sensor, a thermochromic device, and like devices. This invention relates also to the vanadium oxide film, the bolometer-type infrared sensor comprising the vanadium oxide film, and a method of manufacturing the vanadium oxide film.

An infrared sensor element and its manufacturing method are disclosed in Japanese Patent Prepublication (A) No. 136,379 of 1991. A method of manufacturing an infrared sensor is revealed in Japanese Patent Prepublication (A) No. 307,977 of 1992. Use of a vanadium oxide film is, however, described in neither of these Japanese patent prepublications.

A vanadium oxide layer is known suitable for use in a bolometer and as a thermochromic material. In the vanadium oxide film, vanadium has various valences between three and four to provide various oxides like a non-stoichiometric oxide $VO_x$. It is consequently necessary on using the vanadium oxide film in a bolometer-type infrared sensor device and a thermochromic device to control a resistivity or specific resistance of the vanadium oxide film.

For control of the specific resistance, an article is contributed by G. V. Jorgenson and J. C. Lee to Solar Energy Materials, 14 (1986), pages 205 to 214 under the title of "Doped Vanadium Oxide for Optical Switching Films". In this Jorgenson et al article, the specific resistance is controlled by doping a vanadium dioxide film with niobium, tantalum, tungsten, molybdenum, or a like dopant. Such control is, however, not satisfactorily reproducible when the vanadium oxide film is manufactured in whichever of a sol-gel process, sputtering, and chemical deposition. Furthermore, another problem is inevitable such that the specific resistance has a smaller temperature coefficient when an amount of doping is greater.

On the other hand, it has been the practice in a bolometer-type infrared sensor to use a titanium oxide film, a vanadium dioxide film, or a similar film. Examples are described in U.S. Pat. No. 5,286,976 issued to Barrett E. Cole, an article contributed by Guillermo Guzman and two others to Materials Research Bulletin, Volume 29 (1994), No. 5, pages 509 to 515, under the title of "Synthesis of Vanadium Dioxide Thin Films from Vanadium Alkoxides", and another article contributed by Hubert Jerominek and two others to Optical Engineering, Volume 32 (1993), No. 9, pages 2092 to 2099, under the title of "Vanadium Oxide Films for Optical Switching and Detection". Incidentally, an article is contributed by D. P. Partlow and three others to Journal of Applied Physics, Volume 70 (1991), No. 1 (1 Jul.), pages 443 to 452, under the title of "Switchable Vanadium Oxide Films by a Sol-Gel Process". In this Partlow et al article, the fact is described that vanadium oxide has thirteen distinct phases between vanadium dioxide and vanadium sesquioxide.

Titanium oxide and vanadium dioxide have specific resistances of a great temperature coefficient which is important for use in the bolometer-type infrared sensor device. The specific resistance of the titanium oxide film is as low as 0.01 ohm.cm. Its temperature coefficient is, however, not so great in absolute value, being −0.2% per degree Celsius. On the other hand, the specific resistance of the vanadium dioxide film is about 10 ohm.cm when manufactured by sputtering. Its temperature coefficient is as great as about −3.5% per degree Celsius at room temperature. It may seem that the vanadium dioxide film is very suitable for use in the bolometer-type infrared sensor device.

In the manner which will later be discussed in greater detail, vanadium dioxide is susceptible to a metal-semiconductor phase transition at about 70° C. This gives rise to a volume variation of vanadium oxide and causes cracks and peel off to render a vanadium oxide film unreliable when the vanadium dioxide film is used in the bolometer-type infrared sensor device which is unavoidably subjected to temperature cycles passing through 70° C.

SUMMARY OF THE INVENTION

It is consequently a principal object of the present invention to provide a method of controlling, with an excellent reproducibility, electric characteristics of a vanadium oxide film manufactured by reducing a vanadium oxide precursory film.

It is another principal object of this invention to provide a vanadium oxide film which is excellent for use as a bolometer-type infrared sensor film.

It is a subordinate object of this invention to provide a vanadium oxide film which is of the type described and which has as a great temperature coefficent of specific resistivity as a vanadium dioxide film has and is not susceptible to a metal-semiconductor phase transition in a wide temperature range of below the freezing point of water and above the boiling point of water.

It is still another principal object of this invention to provide a method of manufacturing a vanadium oxide film of the type described.

It is a different principal object of this invention to provide a bolometer-type infrared sensor comprising a vanadium oxide film of the type described.

It is another different principal object of this invention to provide a method of manufacturing a bolometer-type infrared sensor of the type described.

Other objects of this invention will become clear as the description proceeds.

In accordance with an aspect of this invention, there is provided a method of controlling electric characteristics of a vanadium oxide film, comprising the steps of (A) reducing a vanadium oxide precursory film at a heat treatment temperature in a reducing atmosphere into the vanadium oxide film and (B) selecting the heat treatment temperature in a predetermined temperature range to control a specific resistance of the vanadium oxide film.

In accordance with another aspect of this invention, there is provided a vanadium oxide film of a chemical formula $VO_x$ for use as a bolometer-type infrared sensor film, wherein x is greater than 1.875 and less than 2.0.

In accordance with still another aspect of this invention, there is provided a bolometer-type infrared sensor comprising a vanadium oxide film on a semiconductor substrate, which vanadium oxide film is represented by a chemical formula $VO_x$, wherein x is greater than 1.875 and less than 2.0.

In accordance with a different aspect of this invention, there is provided a method of manufacturing a vanadium oxide film of a chemical formula $VO_x$ for use as a bolometer-type infrared sensor film, comprising the step of reducing a vanadium oxide precursory film at a heat treatment temperature in a reducing atmosphere into the vanadium oxide film with the heat treatment temperature selected in a predetermined temperature range to make x have a value greater than 1.875 and less than 2.0.

In accordance with another different aspect of this invention, there is provided a method of manufacturing a bolometer-type infrared sensor, comprising the steps of (A) forming a vanadium oxide precursory film on a semiconductor substrate and (B) reducing the vanadium oxide precursory film at a heat treatment temperature in a reducing atmosphere into a vanadium oxide film of a chemical formula $VO_x$ with the heat treatment temperature selected to make x have a value greater than 1.875 and less than 2.0.

DESCRIPTION OF THE PREFERRED EMBODIMENTS

Figure 1:
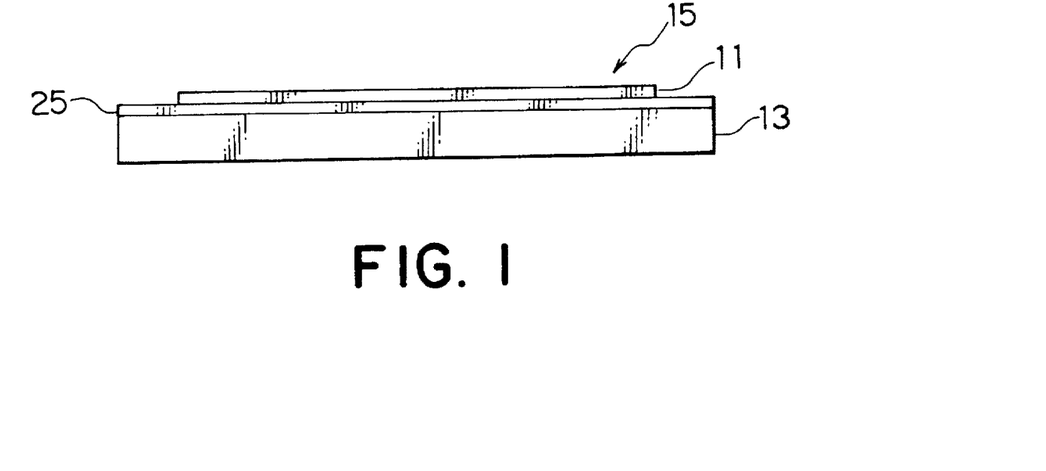
FIG. 1 is a schematic side view of a bolometer-type infrared sensor film for use in describing the instant invention.

Referring to FIG. 1, a bolometer-type infrared sensor comprises a vanadium oxide film 11 on a semiconductor substrate 13. The vanadium oxide film 11 is manufactured by a method according to a preferred embodiment of the present invention. By way of example, the semiconductor substrate 13 is a silicon substrate having a principal surface which is a (001) plane of silicon. It is known that vanadium has a number of valences. Furthermore, vanadium has various valences between three and four. As a consequence, it is possible to deem vanadium oxide as a non-stoichiometric oxide and to represent vanadium oxide by a chemical formula $VO_x$.

Figure 2:
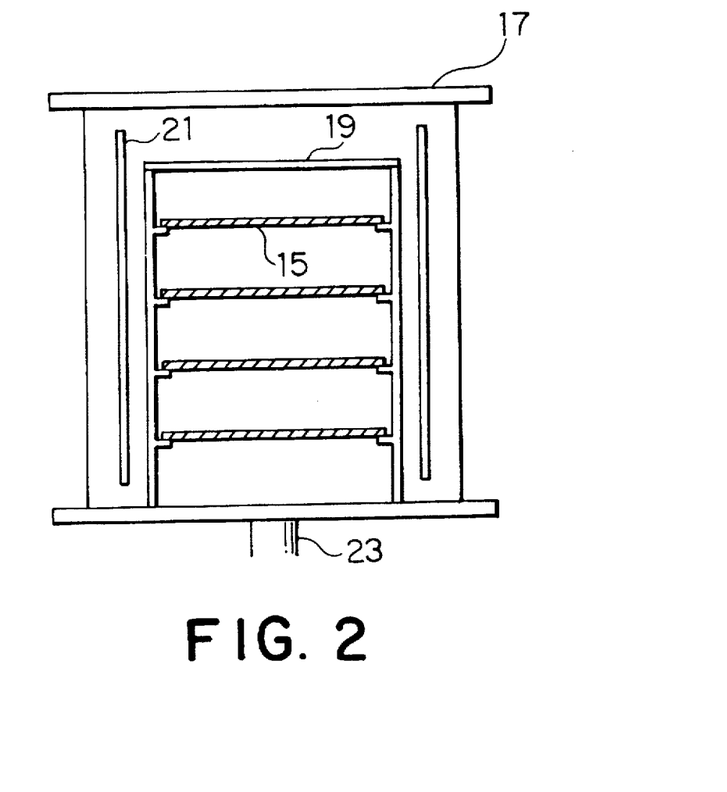
FIG. 2 schematically shows a vertical section of a device for use in implementing a vanadium oxide film manufacturing method according to an embodiment of this invention.

Turning to FIG. 2 with FIG. 1 continuously referred to, the description will proceed to an electric characteristic control method according to a preferred embodiment of this invention. In accordance with this method, a vanadium oxide precursory film is heat treated at a heat or temperature treatment temperature in a reducing atmosphere to reduce the vanadium oxide precursory film into the vanadium oxide film 11. During this heat treatment, the heat treatment temperature is selected in a predetermined temperature range. By optimal determination of the predetermined temperature range, it is possible to control a specific resistance, namely a resistivity, of the vanadium oxide film 11.

In the manner which will presently be described, it has been found that the vanadium oxide film 11 has at room temperature a specific resistance which varies linearly with the heat treatment temperature in the predetermined temperature range, such as between 350° C. and 450° C. The reducing atmosphere is typically an atmosphere of a gas mixture of argon and hydrogen.

For use in the electric characteristic control method, a vanadium pentoxide ($V_2O_5$) film was prepared as the vanadium oxide precursory film. More particulary, a sol of a vanadium compound was deposited dropwise on a silicon wafer to provide a vanadium compound deposited wafer. By heat treating the vanadium compound deposited wafer in air, the silicon wafer w as covered with a vanadium pentoxide film. A silicon wafer with the vanadium oxide precursory film will collectively be referred to as a sample wafer 15 and was prepared in this manner according to the sol-gel method described, for example, in the Partlow et al article as a sol-gel process or in the Guzman et al article as a sol-gel route. The vanadium oxide precursory film had a film thickness of 100 nm.

For the method being illustrated, a vacuum envelope 17 was used. Sample wafers 15 were set on a sample holder 19 and were placed in the vacuum envelope 17 together with a sample heater 21. After the vacuum envelope 17 was evacuated through an exhaust pipe 23 to $10^{-6}$ Torr or below, the gas mixture of argon and hydrogen was introduced into the vacuum envelope 17 to a pressure of 0.25 atmosphere to provide the reducing atmosphere. In the gas mixture, a hydrogen concentration was 5%. Subsequently, the sample wafers 15 were heated to the heat treatment temperature for eight hours.

In FIG. 2, it should be noted that only the sample wafers 15 are depicted with hatches. No shading is applied to the sample heater 21. Such are merely for clarity of illustration.

Figure 3:
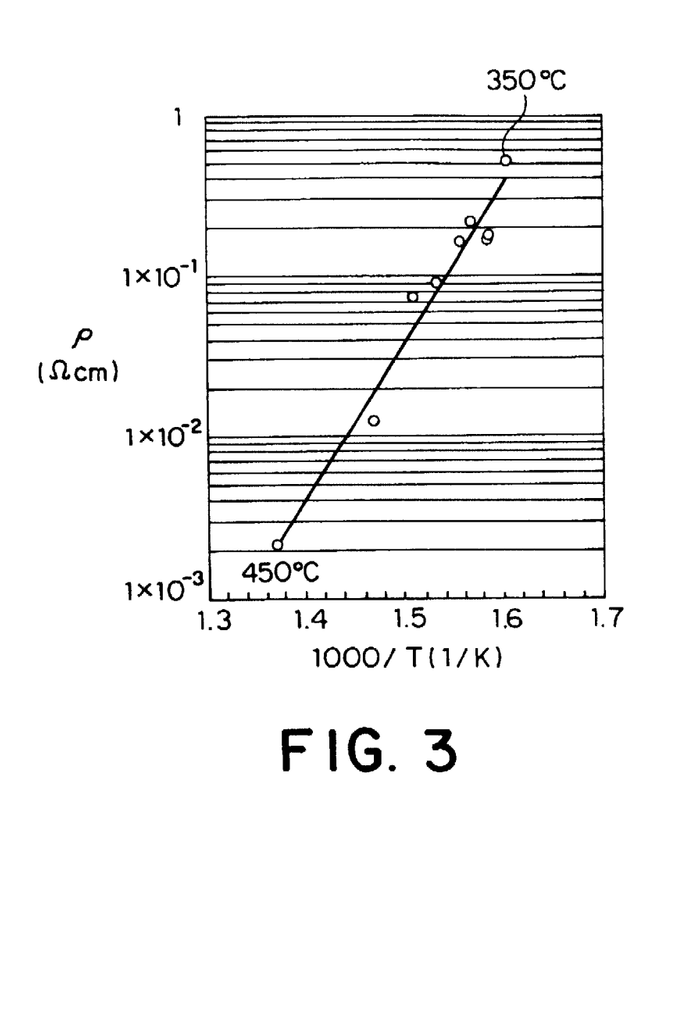
FIG. 3 is a graph representative of a specific resistance of a vanadium oxide film versus a heat treatment temperature which is used in the method described in connection with FIG. 2.

Referring to FIG. 3, it has been confirmed that a degree of reduction of the vanadium oxide precursory film is controlled by the heat treatment temperature. In other words, the specific resistance of the vanadium oxide film 11 (FIG. 1) is controlled by varying the heat treatment temperature in the predetermined temperature range. In FIG. 3, the ordinate shows a specific resistance ρ at room temperature in ohm.cm. The abscissa shows an inverse absolute temperature of the heat treatment temperature as 1000/T in per Kelvin. Small circles represent results of measurements for various heat treatment temperatures T. In the manner indicated by labels attached to the small circles, the heat treatment temperature is 350° C. at the top and 450° C. at the bottom.

From FIG. 3, it is understood that the specific resistance at room temperature was greater and smaller when the heat treatment temperature was low and high. More in detail, the specific resistance was 0.002 ohm.cm and 0.5 ohm.cm at room temperature when the heat treatment temperature was 450° C. or 723 K. and 350° C. or 623 K. It was thus possible to control the specific resistance beyond two orders of magnitude. This has been a result of variation in the vanadium oxide film 11 from a five-valence phase in the vanadium oxide precursory film down to a three-valence phase at 450° C. through a four-valence phase at 350° C. In addition, a substantially linear relation was confirmed between a logarithmic value of the specific resistance at room temperature and the inverse absolute temperature.

Figure 4:
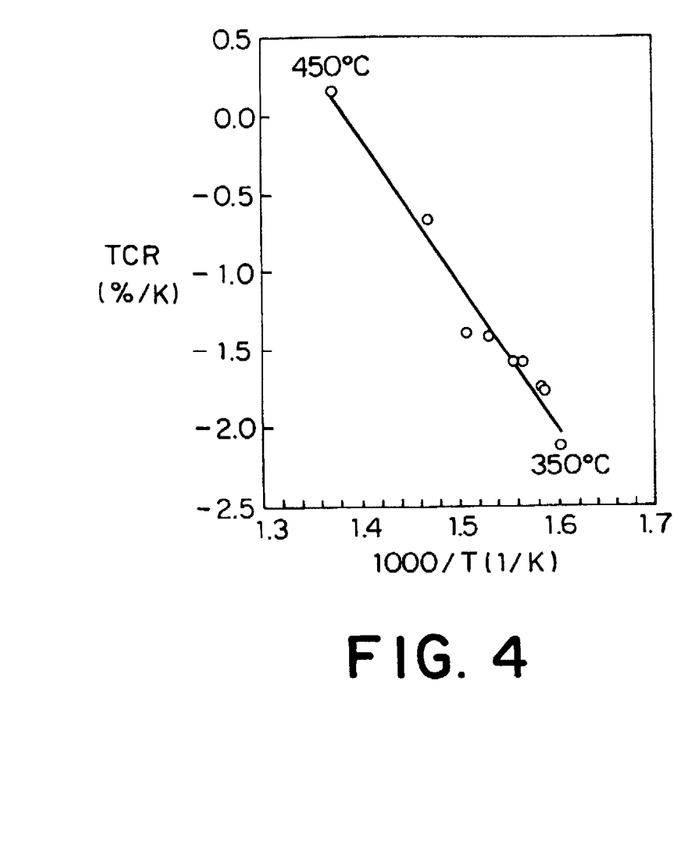
FIG. 4 shows a temperature coefficient of specific resistance versus the heat treatment temperature mentioned in connection with FIG. 2.

Referring to FIG. 4, a temperature coefficient of the specific resistance TCR at room temperature is plotted in %/K, namely, percent per degree Celsius versus, again the inverse absolute temperature 1000/T in 1/K. Results of measurement are indicated by small circles with labels of the heat treatment temperature T of 450° C. (top) and 350° C. (bottom) like in FIG. 3.

It is seen in FIG. 4 that the temperature coefficient of specific resistance at room temperature had an absolute value linearly controlled over a wide range when the heat treatment temperature was varied in the predetermined temperature range. More in detail, the room-temperature temperature coefficient of specific resistance was −2.2%/K. at the heat treatment temperature of 350° C. for the four-valence phase and was 0.2%/K. at the heat treatment temperature of 450° C. for the three-valence phase in the vanadium oxide film 11 (FIG. 1).

Reviewing FIGS. 2 through 4, what should be noted is that it is possible to form the vanadium oxide precursory film not only by the sol-gel method but also by any one of sputtering, chemical deposition, pulse laser ablation, and other methods. The hydrogen concentration is not critical and may be, for example, 3%. It is possible by such an electric characteristic control method to control the specific resistance and the temperature coefficient of specific resistance of the vanadium oxide film 11 (FIG. 1) reliably and with excellent reproducibility.

Figure 5:
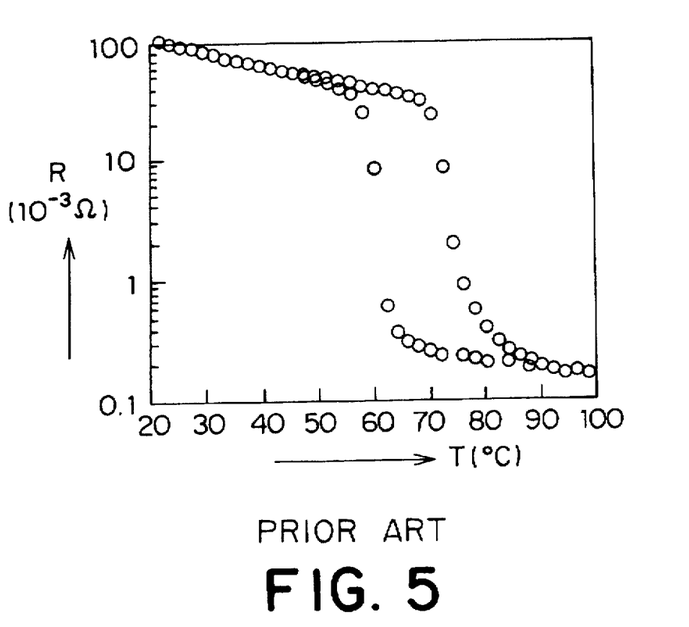
FIG. 5 is a graph representative of a resistance of a vanadium dioxide film versus temperature for use as a reference.
Figure 6:
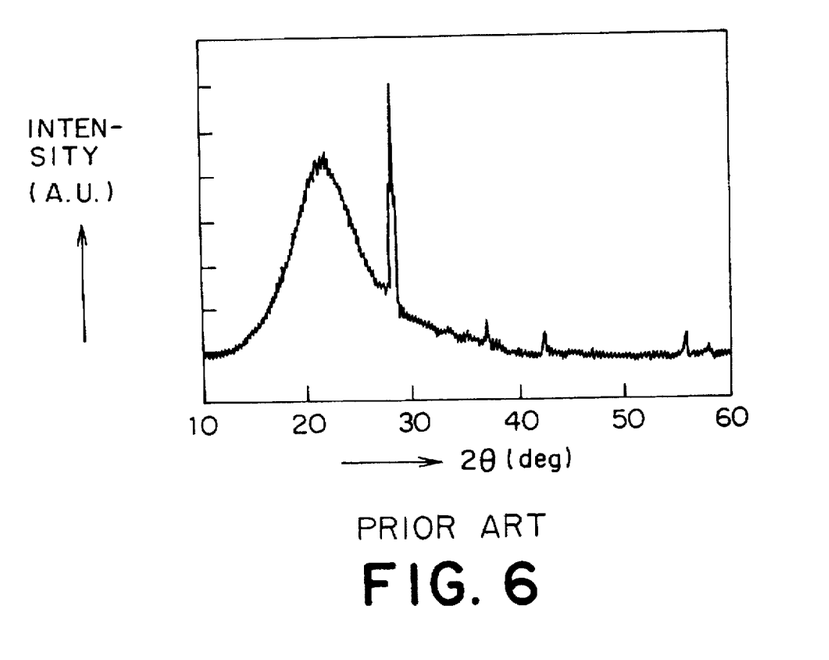
FIG. 6 schematically shows an X-ray diffraction pattern of a vanadium dioxide film for reference.

Turning to FIGS. 5 and 6, graphs are borrowed from the Guzman et al article mentioned heretobefore. This is in order to discuss the applicability of the vanadium dioxide film as the bolometer-type infrared sensor film or in a bolometer-type infrared sensor.

As depicted in FIG. 5 versus temperature which is herein denoted by T in Celsius although different from the heat treatment temperature described above, the vanadium dioxide film has a resistance R which is scaled along the ordinate in $10^{-3}$ ohm and steeply decreases from a higher value in a low-temperature phase of below about 50° C. to a lower value in a high-temperature phase of above about 80° C. by almost three orders of magnitude. The vanadium dioxide film has in this manner a great temperature coefficient of specific resistance and is an excellent bolometer-type infrared sensor film in this respect. In addition, vanadium dioxide has the resistance of only about 10 ohm.cm and the temperature coefficient of specific resistance of about −3.5% per degree Celsius at room temperature and is seemingly an excellent material for use in the bolometer-type infrared sensor in contrast to titanium oxide which has a very small specific resistance of 0.01 ohm.cm at room temperature and nevertheless a too small temperature coefficient of only −0.2%/K.

Vanadium dioxide is, however, susceptible to a metal-semiconductor phase transition at about 70° C. This accounts for a heating-cooling hystersis effect of a width of about 10° C. as shown in FIG. 5 and is objectionable for use in the bolometer-type infrared sensor in practice.

In FIG. 6, illustrated is an X-ray diffraction pattern of the vanadium dioxide film at room temperature. The diffraction pattern has a peak intensity when vanadium dioxide powder has the (011) orientation. Other peaks are observed when the vanadium dioxide powder is oriented as indicated by Miller's notations. This pattern is coincident with the pattern of JCPDS (Joint Committee of Powder Diffraction Standard), used also in the Partlow et al article, Card No. 43-1051.

More specifically, vanadium dioxide has a semiconductor phase of the monoclinic system as the low-temperature phase, wherein plus four-valence vanadium ions are arranged in pairs. The metal-semiconductor phase transition changes the semiconductor phase to the high-temperature phase of a metal phase of the tetragonal system wherein the plus four-valence vanadium ions are arranged equidistant in the C-axis direction to have the rutile structure. The metal-semiconductor phase transition consequently is a change in crystal structure and results in a variation in volume of the vanadium dioxide film to give rise to cracks in the film and peel off of the film from the substrate when the bolometer-type infrared sensor film is used with the temperature cyclically varied passing through 70° C. Moreover, the temperature coefficient of specific resistance of vanadium dioxide nonlinearly varies with temperature in a temperature range including about 60° C. and 80° C. and has different values when the temperature is raised and reduced beyond this temperature range. In other words, vanadium dioxide film is unreliable for use in the bolometer-type infrared sensor.

Referring again to FIG. 1, the semiconductor substrate 13 comprises a silicon substrate which is designated once more by the reference numeral 13 and has the (001) plane as the principal surface. By thermal oxidation known in the art, a silicon dioxide layer 25 is formed along the principal surface to a layer thickness of 200 nm. A vanadium compound was deposited by the sol-gel method on the semiconductor substrate 13, or on the silicon dioxide layer 25, to form a vanadium compound film of the film thickness of 100 nm. The vanadium compound film was heated in a furnace at 450° C. for one hour in an oxygen stream into the vanadium pentoxide film for use as the vanadium oxide precursory film.

Using the vacuum envelope of the type exemplified in FIG. 2 at 17, the vanadium oxide precursory film was reduced at 370° C. for eight hours in a stream of a gas mixture of argon and hydrogen of a flow rate of 0.5 liter per minute. In such manners, the vanadium oxide film 11 was manufactured. The hydrogen concentration was 30%. It is equally possible to manufacture the vanadium oxide film 11 by using sputtering instead of the sol-gel method.

Figure 7:
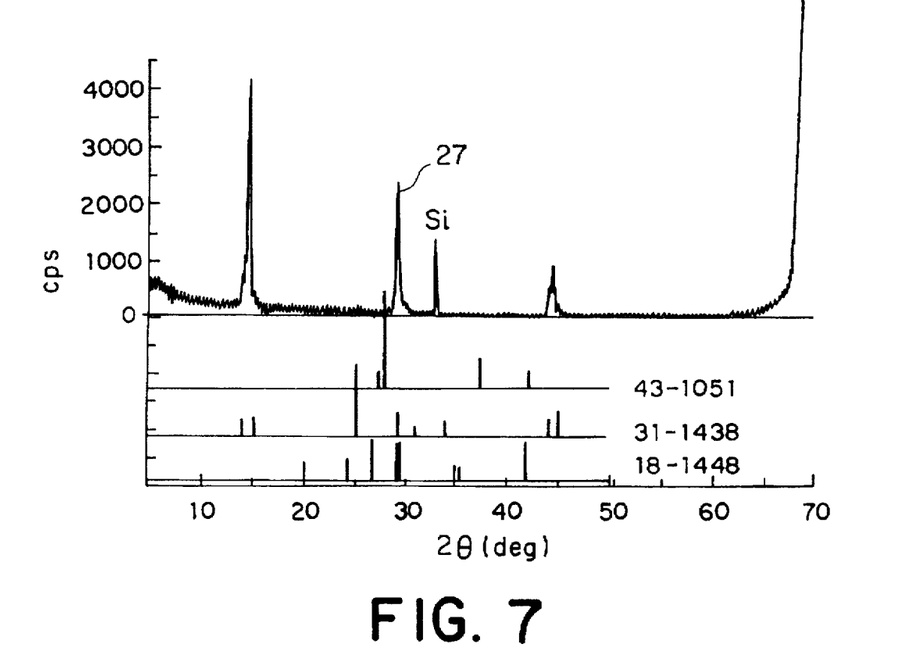
FIG. 7 schematically shows an X-ray diffraction pattern of a vanadium oxide film of this invention together with a few X-ray diffraction patterns depicted for reference.

Referring now to FIG. 7, an X-ray diffraction pattern 27 was observed in connection with the vanadium oxide film 11 on the silicon substrate 13, both illustrated with reference to FIG. 1. A peak with a legend Si shows a line pattern of the silicon substrate 13. Pattern of the JCPDS Cards Nos. 43-1051, 31-1438, and 18-1448 are shown below the pattern 27 of vanadium oxide film 11.

The pattern 27 is not similar to the pattern of the JCPDS Card No. 43-1051. This shows that the vanadium oxide film 11 is not a vanadium dioxide film. Instead, the pattern 27 has peaks coincident with some of the peaks of the JCPDS Card No. 31-1438. Although the Card No. 31-1438 refers to vanadium dioxide, the fact should be noted such that vanadium provides sorts of nonstoichiometric oxides between three and four valences. In the vanadium oxide $VO_x$, x is therefore not exactly equal to two but is clearly less than two. On the other hand, x is obviously greater than 1.875 and is different in this manner from $V_8O_{15}$ which has a crystal structure of the Magneli phase and of which an X-ray diffraction pattern is represented by the JCPDS Card No. 18-1448.

Figure 8:
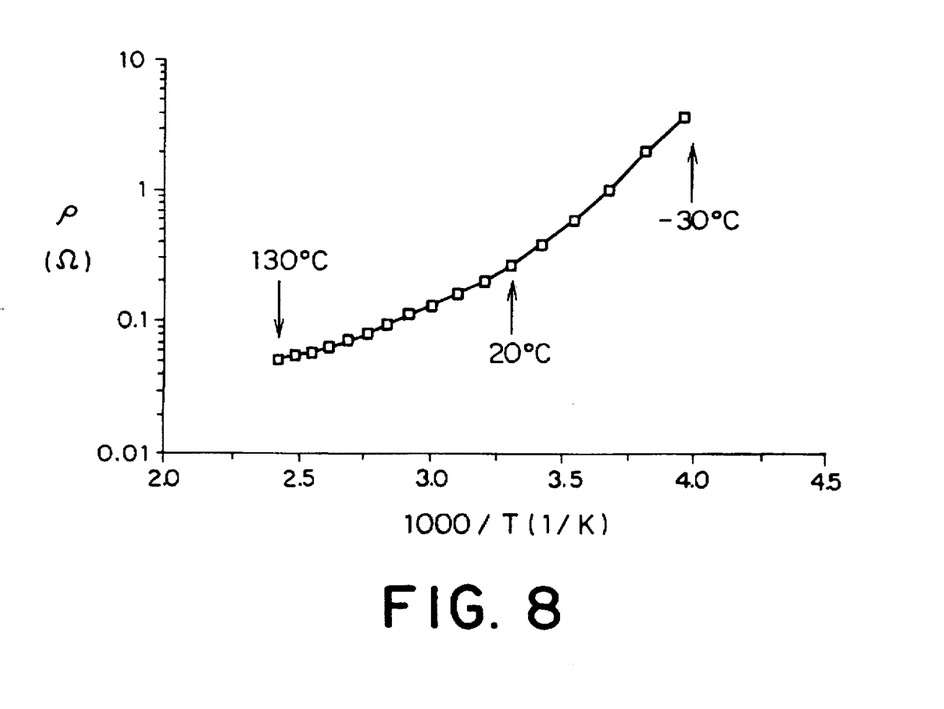
FIG. 8 shows a specific resistance of the vanadium oxide film mentioned in connection with FIG. 7 versus inverse absolute temperature.

Turning to FIG. 8, the specific resistance ρ of the vanadium oxide film 11 (FIG. 1) was measured with the temperature T varied. For this purpose, electrodes (not shown)

of silver paste were attached to an exposed surface of the vanadium oxide film 11. The vanadium oxide film 11 with the electrodes was placed in a thermostat. Its internal temperature was stepwise varied between −30° C. and 130° C. By resorting to a conventional four-probe method, a temperature dependency of the specific resistance was measured.

Results are illustrated in FIG. 8. The specific resistance had a monotonously decreasing tendency with a rise of the temperature from −30° C. to 130° C.

Figure 9:
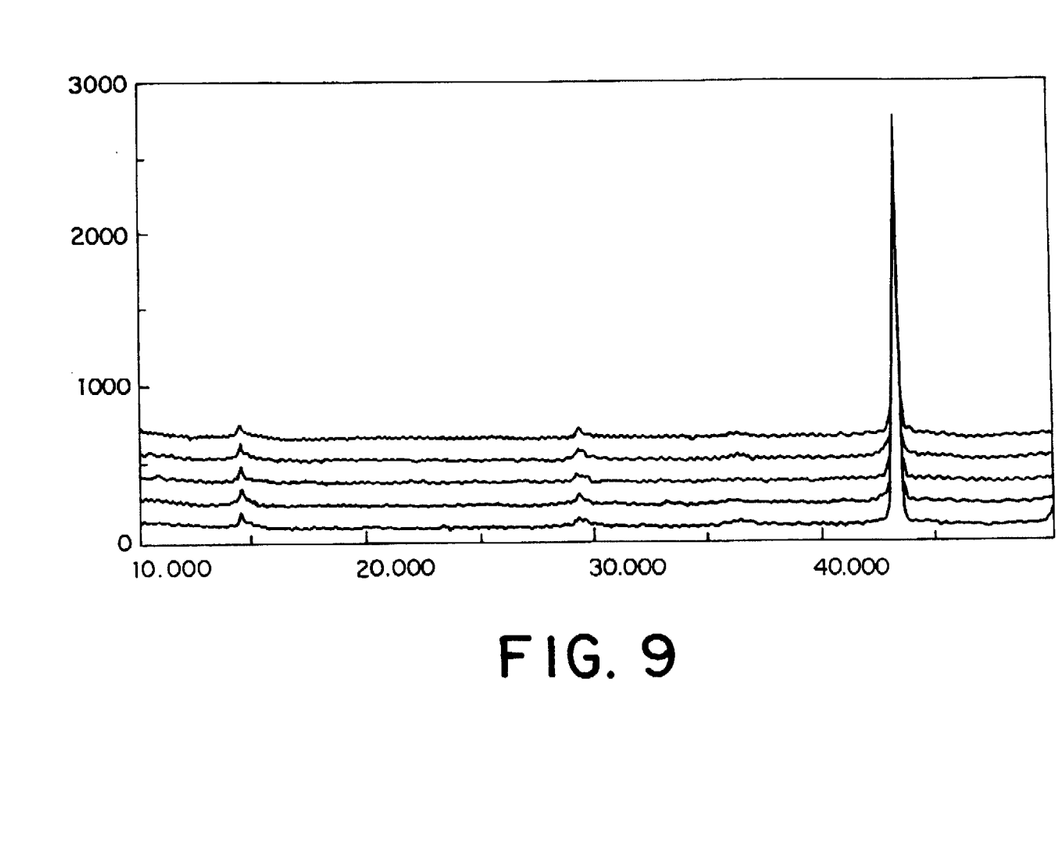
FIG. 9 schematically shows X-ray diffraction patterns observed at several temperatures between 20° and 200° C. for the vanadium oxide film mentioned in connection with FIG. 7.

Further turning to FIG. 9, X-ray diffraction patterns of the vanadium oxide film 11 (FIG. 1) were observed with the vanadium oxide film 11 kept at several temperatures between room temperature and 200° C. At temperatures between 20° C. and 200° C., the diffraction patterns were in substantial agreement with that depicted in FIG. 7 except that a sharp peak was observed at 2 θ of about 43 degrees as a result of copper (Cu) contained in a sample holder.

Reviewing FIGS. 7 through 9 with FIGS. 5 and 6 taken into consideration, the vanadium oxide film 11 (FIG. 1) has, at room temperature, a specific resistance of about 0.2 ohm.cm and a temperature coefficient of specific resistance of −1.6%/K. The vanadium oxide film 11 is not subjected to the metal-semiconductor phase transition and the resulting sudden variation in the specific resistance in a wide temperature range between −30° C. and 130° C. in which a bolometer-type infrared sensor should be operable. As a result of no metal-semiconductor phase transition, no objectionable variation of volume occurs in the vanadium oxide film 11. The bolometer-type infrared sensor is therefore reliable when composed of the vanadium oxide film 11. It should be noted as described before that vanadium oxide $VO_x$ (x being greater than 1.875 and less than 2.0) in the vanadium oxide film 11 is unquestionably different from vanadium dioxide although the X-ray diffraction pattern of the Card No. 31-1438 is identified in the JCPDS as $VO_2$.

The vanadium oxide film 11 has the specific resistance that is smaller than that of the vanadium dioxide film. Its temperature coefficient of specific resistance is greater by one order of magnitude than that of a titanium oxide ($TiO_x$) film and moreover does not suddenly vary but linearly varies in the wide temperature range between −30° C. and 130° C. As a consequence, the vanadium oxide film 11 is very useful as and for use in the bolometer-type infrared sensor.

When the heat treatment temperature was 450° C. or higher, the vanadium oxide precursory film was reduced to a single-phase vanadium sesquioxide ($V_2O_3$) film. When the heat treatment temperature was 350° C. or lower, the vanadium oxide precursory film was reduced to a typical vanadium dioxide film where X-ray diffraction pattern was in exact coincidence with the JCPDS Card No. 43-1051.

The predetermined temperature range is consequently determined for the heat treatment temperature as lower than 450° C. and higher than 350° C.

While a novel vanadium oxide film and methods of manufacturing such vanadium oxide films have thus far been described in specific conjunction with several preferred embodiments of this invention, it will now be readily possible for one skilled in the art to carry this invention into effect in various other manners. Above all, it should be noted in FIG. 1 that the vanadium oxide film 11 need not be integrally spread on the semiconductor substrate 13 but may be arranged as an array of separate picture element cells.

What is claimed is:

1. A method of controlling electric characteristics of a vanadium oxide film, comprising the steps of reducing a vanadium oxide precursory film at a heat treatment temperature in a reducing atmosphere into said vanadium oxide film and selecting said heat treatment temperature in a predetermined temperature range to control a specific resistance of said vanadium oxide film.

2. A method as claimed in claim 1, wherein said predetermined temperature range is determined to vary said specific resistance linear with said heat treatment temperature in said predetermined temperature range.

3. A method as claimed in claim 2, wherein said predetermined temperature range is higher than 350° C. and lower than 450° C.

4. A method as claimed in claim 3, wherein said reducing atmosphere is an atmosphere of a mixture of argon and hydrogen.

5. A method as claimed in claim 4, wherein said specific resistance is between 0.5 and 0.002 ohm.cm at room temperature when said heat treatment temperature is higher than 350° C. and lower than 450° C.

6. A method as claimed in claim 5, wherein said specific resistance has a temperature coefficient between −2.2% per degree Celsius and 0.2% per degree Celsius at room temperature when said heat treatment temperature is higher than 350° C. and lower than 450° C.

7. A vanadium oxide film represented by a chemical formula $VO_x$ for use as a bolometer-type infrared sensor film, wherein x is greater than 1.875 and less than 2.0, wherein said vanadium oxide film is not susceptible to a metal-semiconductor phase transition between −30° C. and 130° C. and has a temperature coefficient of specific resistance greater than −1% per degree Celsius at 25° C.

8. A vanadium oxide film as claimed in claim 7, wherein said vanadium oxide film has a specific resistance which varies continuously when said vanadium oxide film is between −30° C. and 130° C.

9. A bolometer-type infrared sensor comprising a vanadium oxide film on a semiconductor substrate, said vanadium oxide film being represented by a chemical formula, $VO_x$, wherein x is greater than 1.875 and less than 2.0, wherein said vanadium oxide film is not susceptible to a metal-semiconductor phase transition between −30° C. and 130° C. and has a temperature coefficient of specific resistance greater than −1% per degree Celsius at 25° C.

10. A bolometer-type infrared sensor as claimed in claim 9, wherein said vanadium oxide film has a specific resistance which varies continuously when said vanadium oxide film is between −30° C. and 130° C.

11. A method of manufacturing a vanadium oxide film of a chemical formula $VO_x$ for use as a bolometer-type infrared sensor film, comprising the step of reducing a vanadium oxide precursory film at a heat treatment temperature in a reducing atmosphere into said vanadium oxide film with said heat treatment temperature selected in a predetermined temperature range to make x have a value greater than 1.875 and less than 2.0.

12. A method as claimed in claim 11, wherein said predetermined temperature range is determined to vary a specific resistance of said vanadium oxide film linear with said heat treatment temperature in said predetermined temperature range.

13. A method as claimed in claim 12, wherein said predetermined temperature range is higher than 350° C. and lower than 450° C.

14. A method as claimed in claim 13, wherein said reducing atmosphere is an atmosphere of a mixture of argon and hydrogen.

15. A method of manufacturing a bolometer-type infrared sensor, comprising the steps of forming a vanadium oxide precursory film on a semiconductor substrate and reducing said vanadium oxide film at a heat treatment temperature in a reducing atmosphere into a vanadium oxide film of a chemical formula $VO_x$ with said heat treatment temperature selected in a predetermined temperature range to make x have a value greater than 1.875 and less than 2.0.

16. A method as claimed in claim 15, wherein said predetermined temperature range is determined to vary a specific resistance of said vanadium oxide film linear with said heat treatment temperature in said predetermined temperature range.

17. A method as claimed in claim 16, wherein said predetermined temperature range is between 350° C. and 450° C., both exclusive.

18. A method as claimed in claim 17, wherein said reducing atmosphere is an atmosphere of a mixture of argon and hydrogen.

* * * * *